United States Patent
Chen et al.

(10) Patent No.: US 10,641,838 B2
(45) Date of Patent: May 5, 2020

(54) TESTING APPARATUS FOR POWER SUPPLY UNIT AND METHOD FOR THE SAME

(71) Applicant: DELTA ELECTRONICS, INC., Taoyuan (TW)

(72) Inventors: Chang-Tai Chen, Taoyuan (TW); Yu-Jen Chen, Taoyuan (TW); Tien-He Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 281 days.

(21) Appl. No.: 15/840,099

(22) Filed: Dec. 13, 2017

(65) Prior Publication Data

US 2018/0196110 A1     Jul. 12, 2018

(30) Foreign Application Priority Data

Jan. 11, 2017    (CN) .................... 2017 2 0032796 U

(51) Int. Cl.
     *G01R 31/40*      (2020.01)
(52) U.S. Cl.
     CPC ................... *G01R 31/40* (2013.01)

(58) Field of Classification Search
     CPC ....................................... G01R 31/40
     USPC ............................. 324/538, 764.01
     See application file for complete search history.

(56) References Cited

U.S. PATENT DOCUMENTS

2016/0169956 A1*   6/2016   Kim ...................... G06F 11/00
                                                          307/125

\* cited by examiner

*Primary Examiner* — Farhana A Hoque
(74) *Attorney, Agent, or Firm* — Hauptman Ham, LLP

(57) ABSTRACT

A testing apparatus is used for testing a USB type power supply unit connected to a power supply unit and includes: a connection port receiving a power supply from the power supply unit; a first conversion unit connected to the connection port and converting the power supply to an input voltage; a control unit connected to the connection port and the first conversion unit and receiving the input voltage; a plurality of switch units connected to the control unit. The control unit obtains the number of voltage values of the power supply according to power supply information by the power supply unit; the number of voltage values of the power supply is the number of different voltage values that the power supply can support, and each voltage value corresponds to the switch units.

16 Claims, 3 Drawing Sheets

TESTING APPARATUS FOR POWER SUPPLY UNIT AND METHOD FOR THE SAME

BACKGROUND OF THE INVENTION

Field of the Invention

The present invention relates to a power supply unit testing apparatus and a testing method for the same, especially to a testing apparatus used for testing a USB type power supply unit and a testing method for the same.

Description of Related Art

The most important characteristic of USB type (USB Type-C for example) power supply is switching output voltage through USB PD (USB Power Delivery). Therefore, it is needed to test if an output voltage of the power supply is normal with a USB control apparatus cooperating with a test interface before the USB type power supply is out of factory. The power supply unit testing apparatus is used to test the power supply unit in RD testing, to test the power supply unit at station in factory, or to perform simple test at user site.

However, the existing USB type button control board has the following drawbacks:

1. Additional power source provided to a power supply unit testing apparatus is needed: because the existing power supply unit testing apparatus needs additional power source provided to drive the power supply unit testing apparatus before testing if the outputs of the power supply unit are normal, this results in usage inconvenience of testing the power supply unit.

2. An output voltage of the power supply unit cannot be recorded before the power supply unit testing apparatus is powered off: because the existing power supply unit testing apparatus cannot record the output voltage of the power supply unit before the power supply unit testing apparatus is powered off, a different input voltage is used for testing the same power supply unit (for example, input AC 110V is switched to 220V), this makes power inputted to the power supply unit be turned on after being turned off, it needs reconfiguration to make the output voltage value of the power supply unit be equal to that before being powered off. Thus the test time of the power supply unit cannot be decreased, resulting in low test efficiency of the power supply unit testing apparatus.

3. Lack of function of checking output of the power supply unit: because the existing power supply unit testing apparatus cannot determine if an output of the power supply unit match a selected voltage value of the power supply unit testing apparatus, it leads to a misjudgment for yield rate of the power supply unit.

Therefore, it is an object to develop a power supply unit testing apparatus and a testing method for the same, to convert a power source from a power supply unit to drive a power supply unit testing apparatus directly through a conversion unit, and to use a feedback signal to ensure function of the power supply unit outputs, and then to cooperate with a memory unit to record the output voltage of the power supply unit before the power supply unit testing apparatus is powered off.

SUMMARY OF THE INVENTION

Accordingly, it is an object of the present invention to provide a power supply unit testing apparatus, the power supply unit testing apparatus of the present invention is connected to a power supply unit, the power supply unit testing apparatus includes a connection port, a first conversion unit, and a control unit. The connection port receives a power supply from the power supply unit. The first conversion unit is connected to the connection port, and converts a power source of the power supply to an input voltage. The control unit is connected to the connection port and the first conversion unit, and receives the input voltage. A power source of the power supply unit testing apparatus is from the power supply of the power supply unit.

In an embodiment, the power supply unit testing apparatus further includes a plurality of switch units being connected to the control unit. The control unit obtains a voltage value of the power supply and a number of different voltage values supportable by the power supply according to power supply information of the connection port, the number of the voltage values supportable by the power supply is that of the different voltage values supportable by the power supply unit, and each voltage value corresponds to one of the switch units.

In an embodiment, when one of the switch units is turned on, the control unit outputs a control signal to the connection port, to adjust the voltage value of the power supply to an ideal voltage value corresponding to the one of the switch units.

In an embodiment, the control unit further includes a second conversion unit. The second conversion unit is electrically connected to the connection port. When one of the switch units is turned on, the control unit determines if the voltage value of the power supply matches an ideal voltage value corresponding to one of the switch units according to the second conversion unit.

In an embodiment, the power supply unit testing apparatus further includes a ratio adjustment unit. The ratio adjustment is connected between the connection port and the second conversion unit. The ratio adjustment unit adjusts a ratio of the power supply to a voltage value tolerable by the second conversion unit.

In an embodiment, the power supply unit testing apparatus further includes an alarm unit. The alarm unit is connected to the control unit. When the control unit determines that the voltage value of the power supply does not match the ideal voltage value corresponding to one of the switch units according to the second conversion unit, the control unit sends an alarm signal to the alarm unit.

In an embodiment, the control unit further includes a memory unit. The memory unit stores the voltage value of the power supply according to the power supply information before the power supply unit testing apparatus is powered off.

In an embodiment, the memory unit is built in the control unit or mounted outside the control unit, and connected to the control unit.

In an embodiment, the control unit further includes a first controller and a second controller. The first controller is connected to the connection port and the first conversion unit, receives the input voltage. The second controller is connected to the first controller and the first conversion unit, and receives the input voltage. The second controller receives power supply information of the connection port through the first controller, and outputs a control signal to control the voltage value of the power supply through the first controller.

In an embodiment, the power supply unit testing apparatus further includes a plurality of switch units. The switch units are connected to the second controller. The second controller obtains the voltage value of the power supply and a number of different voltage values supportable by the power supply according to the power supply information; the number of the voltage values supportable by the power supply is that of the different voltage values of the power supply, and each voltage value corresponds to one of the switch units.

In an embodiment, when one of the switch units is turned on, the second controller outputs the control signal to the connection port through the first controller, to adjust the voltage value of the power supply to an ideal voltage value corresponding to the one of the switch units.

In an embodiment, the second controller further includes a second conversion unit. The second conversion unit is electrically connected to the connection port. When one of the switch units is turned on, the second controller determines if the voltage value of the power supply matches an ideal voltage value corresponding to the one of the switch units according to the second conversion unit.

In an embodiment, the power supply unit testing apparatus further includes a ratio adjustment unit. The ratio adjustment unit is connected between the connection port and the second conversion unit. The ratio adjustment unit adjusts a ratio of the power supply to a voltage value tolerable by the second conversion unit.

In an embodiment, the power supply unit testing apparatus further includes an alarm unit. The alarm unit is connected to the second controller. When the second controller determines that the power supply does not match the ideal voltage value corresponding to the one of the switch units according to the second conversion unit, the second controller sends an alarm signal to the alarm unit.

In an embodiment, the first controller or the second controller further includes a memory unit. The memory unit stores the voltage value of the power supply according to the power supply information before the power supply unit testing apparatus is powered off.

In an embodiment, the memory unit is built in the first controller or the second controller; or mounted outside the first controller, and connected to the first controller; or mounted outside the second controller, and connected to the second controller.

Accordingly, it is an object of the present invention to provide a power supply unit testing method. Thus, the power supply unit testing method of the present invention is used for testing a power supply unit, the testing method includes: (a) providing a power supply unit testing apparatus being connected to the power supply unit, and configured to receive a power supply from the power supply unit; (b) using the power supply unit testing apparatus to obtain a voltage value of the power supply and a number of different voltage values supportable by the power supply according to power supply information of the connection port, and each voltage value corresponding to a plurality of switch units of the power supply unit testing apparatus; (c) recording an ideal voltage value corresponding to one of the switch units when the one of the switch units is turned on; (d) using the power supply unit testing apparatus to determine if the voltage value of the power supply matches the ideal voltage value corresponding to the one of the switch units; and (e) sending an alarm signal when the power supply unit testing apparatus determines that the voltage value of the power supply does not match the ideal voltage value corresponding to the one of the switch units.

In an embodiment, a number of voltage values supportable by the power supply is that the different voltage values of the power supply.

In an embodiment, the power supply unit testing apparatus further stores the voltage value of the power supply before the power supply unit testing apparatus is powered off according to the power supply information.

BRIEF DESCRIPTION OF DRAWING

One or more embodiments of the present invention are illustrated by way of example and not limitation in the figures of the accompanying drawings, in which like references indicate similar elements. These drawings are not necessarily drawn to scale.

DETAILED DESCRIPTION OF THE INVENTION

Figure 1:
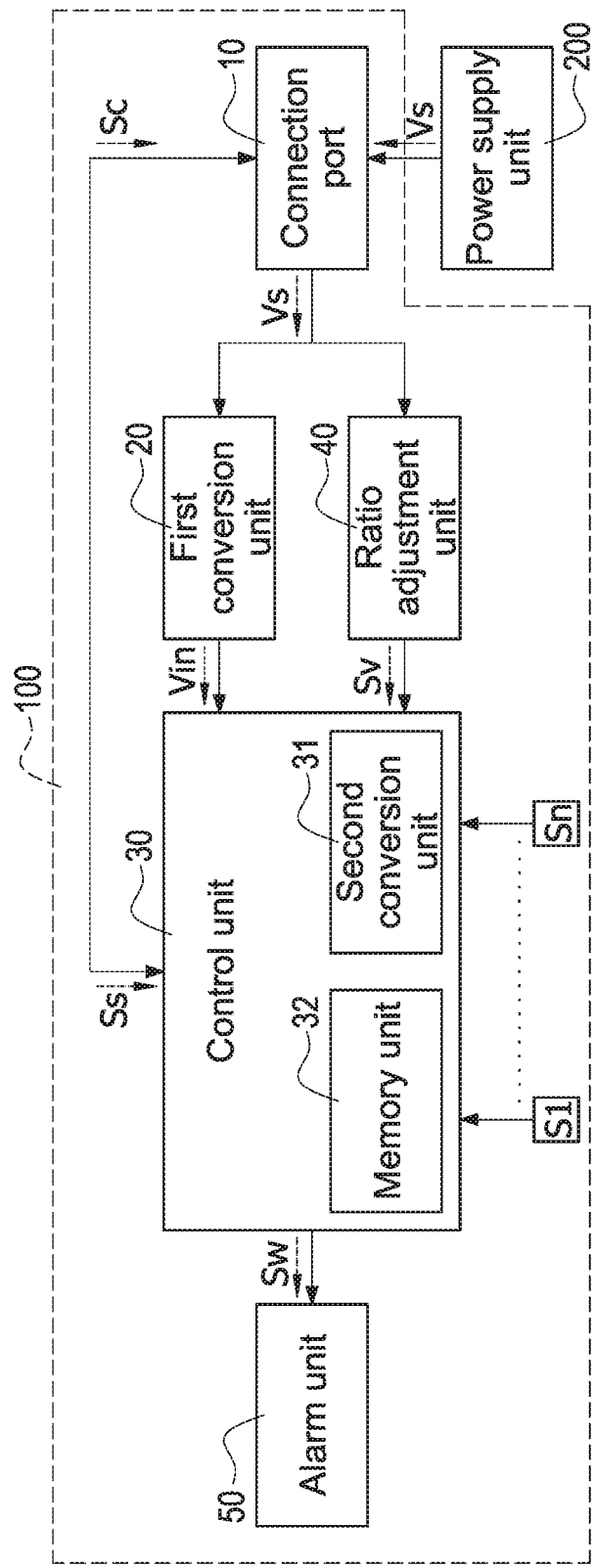
FIG. 1 shows a block diagram of a circuit of the power supply unit testing apparatus according to a first embodiment of the present invention.

Please refer to FIG. 1. FIG. 1 shows a block diagram of a circuit of the power supply unit testing apparatus according to a first embodiment of the present invention. The power supply unit testing apparatus 100 includes a connection port 10, a first conversion unit 20 and a control unit 30. Hereinafter, assume that the connection port 10 is a USB Type-C connection port, and connected to a power supply unit 200 having a USB Type-C connection port, and configured to receive a power supply Vs from the power supply unit 200. The first conversion unit 20 is connected to the connection port 10, and converts the power supply Vs to an input voltage Vin. The control unit 30 is connected to the connection port 10 through the first conversion unit 20, and receives the input voltage Vin. When the USB Type-C connection port of the power supply unit 200 is connected to the connection port 10, and the USB Type-C connection port of the power supply unit 200 outputs the power supply Vs, the first conversion unit 20 converts the power supply Vs to the input voltage Vin for supplying an operational power of the control unit 30. Therefore, a power source of the power supply unit testing apparatus 100 is the power supply Vs from the power supply unit 200, and no additional power source except the power supply Vs from the power supply unit 200 is provided to the power supply unit testing apparatus 100. It should be noted that the first conversion unit 20 is a DC-DC converter, but the type of the converter is not limited. As long as a DC voltage of the USB Type-C connection port 10 is converted to the properly voltage for operation of the control unit 30, it is within a scope of the embodiment.

Refer to FIG. 1 again, the power supply unit testing apparatus 100 further includes a plurality of switch units (S1-Sn), the switch units (S1-Sn) are connected to the control unit 30. The control unit 30 obtains the voltage value of the power supply Vs, and a number of different voltage values supportable by power supply unit 200 according to power supply information Ss in the power supply Vs from the power supply unit 200 on the connection port 10. The number of voltage values supportable by the power supply Vs is that of different voltage values from the power supply unit 200, and each voltage value corresponds to one of the switch units (S1-Sn). The control unit 30 outputs a control signal Sc to the connection port 10, to control the power supply unit 200 to switch the voltage values from the power supply Vs. The power supply information Ss at least includes number of different voltage values supportable by the power supply unit 200 and the corresponding ideal voltages. Because the connection port 10 is a USB Type-C connection port, and connected to the power supply unit 200 having the USB Type-C connection port, the power supply Vs at least includes voltage value of the power supply (such as 5V) and the power supply information Ss. It should be noted that, in the embodiment, a number of the switch units (S1-Sn) is not limited, as long as the number of the switch units (S1-Sn) is larger than the number of the different voltage values supportable by power supply unit 200. Besides, in the embodiment, the voltage values from the power supply Vs correspond to the switch units (S1-Sn) in an order from small to large, but not limited. In other words, the power supply Vs can satisfy the inventive correspondence as long as each voltage value of the power supply Vs is corresponding to one of the switch units (S1-Sn).

As shown in FIG. 1, the control unit 30 further includes a second conversion unit 31, and the power supply unit testing apparatus 100 further includes a ratio adjustment unit 40. The ratio adjustment unit 40 is connected between the connection port 10 and the second conversion unit 31, and adjusts a ratio of the voltage value of the power supply Vs to voltage information Sv for supplying to the second conversion unit 31. Therefore, the actual voltage value currently from the power supply Vs is known from the voltage information Sv. After the second conversion unit 31 converts the voltage information Sv from analog to digital form, the control unit 30 determines if the actual voltage value of the power supply Vs from the power supply unit 200 matches the ideal voltage value corresponding to one of the switch units (S1-Sn). It should be noted that in the embodiment, the ratio adjustment unit 40 is a voltage follower, but not limited. The ratio adjustment unit 40 could have arbitrary gain as long as the voltage value followed the adjustment of the ratio adjustment unit 40 is tolerable by the second conversion unit 31. Besides, in the embodiment, the second conversion unit 31 is an analog to digital converter, but not limited. In other words, the second conversion unit 31 can be such configured as long as the voltage information Sv processed by the second conversion unit 31 and sent to the control unit 30 could be used to determine if the voltage value of the power supply Vs from the power supply unit 200 matches the voltage value corresponding to one of the switch units (S1-Sn). It should be noted that, each voltage value in the power supply information Ss is the ideal voltage value corresponding to one of the switch units (S1-Sn), rather than the actual voltage value from the power supply unit 200. The voltage information Sv is an actual voltage value output by the current power supply Vs of the power supply unit 200. Because the actual voltage value from the power supply unit 200 suffers voltage drop of different degrees due to output wire, output load, there would be discrepancy between the actual voltage value from the voltage information Sv and the ideal voltage value corresponding to the power supply information Ss. However, the discrepancy is acceptable as long as the control unit 30 could determine if the voltage value of the power supply Vs from the power supply unit 200 matches the voltage value corresponding to one of the switch units (S1-Sn).

Refer to FIG. 1 again, the control unit 30 further includes a memory unit 32, the memory unit 32 stores the power supply information Ss. It should be noted that the memory unit 32 can be arranged outside the control unit 30, and can be realized with an element independent from the controller. In other words, as long as voltage information can be stored in the memory unit, the memory unit 32 could be realized in different manners, either built in the control unit 30 or mounted outside the control unit 30. When the current power supply unit 200 is tested, the memory unit 32 stores the voltage value of the power supply Vs. More specifically, when one of the switch units (S1-Sn) is turned on, the memory unit 32 stores the ideal voltage value corresponding to one of the switch units (S1-Sn). Because the supplying power of the power supply unit testing apparatus 100 is from the power supply unit 200, the power supply Vs is stopped from supplying power if (1) a different input voltage (for example, input AC 110V is switched to 220V) is used to test the same power supply unit 200, (2) the power supply unit 200 is removed after the test is finished, or (3) the power supply unit 200 is removed during the test. When the power supply Vs is stopped from supplying power, the power supply unit testing apparatus 100 is also powered off at the same time, and the voltage value of the power supply Vs (corresponding to the latest turned-on switch unit before powering off of the power supply unit 200) is stored in the memory unit 32. When the power supply unit 200 is powered on after being powered off (for example: input AC 110V has been switched to 220V) or further replaced by another power supply unit, the control unit 30 of prior art has no such memory function. As a result, when the power supply unit testing apparatus 100 of prior art repeats testing the power supply unit 200 or switches the power supply unit 200 to a different input voltage (for example: 110V is switched to 220V), the power supply Vs returns to a default voltage (5V). Therefore, the test needs to be repeated from the default voltage (5V), and these results in longer test time of the power supply unit 200 and low efficiency. The power supply unit testing apparatus 100 of the present invention includes the memory unit 32 and has this memory function, when repeating the testing of the power supply unit 200 or switching the power supply unit 200 to a different input voltage (for example: 110V is switched to 220V), there is no need to start the test from the default voltage (for example: 5V). Therefore, the test time of the power supply unit 200 of the present invention is decreased and the test efficiency is increased. Besides, the connection port 10 is the USB Type-C connection port, and connected to the power supply unit 200 having the USB Type-C connection port, therefore a single USB Type-C connection port 10 not only can receive the power supply Vs, but also can be used to send the power supply information Ss and the control signal Sc.

As shown in FIG. 1, the power supply unit testing apparatus 100 further includes an alarm unit 50, the alarm unit 50 is connected to the control unit 30. When the control unit 30 determines that the voltage value of the power supply Vs from the power supply unit 200 does not match the ideal voltage value corresponding to one of the switch units (S1-Sn), the control unit 30 sends an alarm signal Sw to the alarm unit 50. It should be noted that the alarm unit 50 is used to alarm a fail of the switch of the power supply Vs from the power supply unit 200. Therefore, in the embodiment, the alarm of the alarm unit 50 is not limited to specific form. For example, but not limited, the alarm unit 50 can be audio-video alarm or display alarm.

Refer to FIG. 1 for example, the following description is exemplified with that the power supply unit 200 supports the switching of six different voltage values for the power supply Vs, such as 5V, 10V, 12V, 15V, 18V, 20V, and the power supply unit testing apparatus 100 includes six switch units (S1-S6). Therefore, the control unit 30 obtains that the power supply unit 200 has six different voltage values for the power supply Vs, and has following correspondence with respect to the switch units (S1, 5V; S2, 10V; S3, 12V; S4, 15V; S5, 18V; S6, 20V) according to the power supply information Ss. When one switch unit (such as the switch unit S2) is turned on, the memory unit 32 records the ideal voltage value 10V corresponding to the switch unit S2. At this moment, the control unit 30 outputs a control signal Sc to the connection port 10, and makes the power supply unit 200 output the voltage value (10V) corresponding to the switch unit S2. The ratio adjustment unit 40 adjusts the ratio the voltage value (10V) proportionally to the voltage value withstood by the second conversion unit 31 (assume that 10V is correspondingly adjusted to 2V proportionally), the second conversion unit 31 converts the received analog voltage value 2V to a digital signal according to a resolution of the analog to digital converter and feasible for determination of the control unit 30. The control unit 30 determines if the ideal voltage value (10V) corresponding to the switch unit S2 matches a digital signal from the second conversion unit 31, to make sure if the actual voltage value of the power supply Vs from the power supply unit 200 matches the ideal voltage value (10V) corresponding to the switch unit S2.

When the control unit 30 determines that the voltage value (10V) corresponding to the switch unit S2 does not match the digital signal on the second conversion unit 31 (assume that the digital signal corresponds to the actual voltage value is 5V), the control unit sends the alarm signal Sw to the alarm unit 50 to alarm that the test of the power supply unit 200 is failed. When the switch units (S1-S6) are turned on sequentially, the memory unit 32 stores the voltage value of the power supply Vs corresponding to the switch units (S1-S6) turned on sequentially. In the following description, it is assumed that the memory unit 32 stores the last ideal voltage value for the power supply before being powered off is 20V. When the same power supply unit 200 is tested with a different input voltage (for example: input AC 110V is switched to 220V) or when the test is finished and the power supply unit 200 is removed, the power supply Vs will be powered off first and then be powered on. When the power supply Vs is powered off, the power supply unit testing apparatus 100 is also powered off. When another power supply unit 200' (not shown) with the same specification of output number and voltage is further tested, or the same power supply unit 200 is switched to a different input voltage (for example: 110V is switched to 220V), the control unit 30 directly sends a control signal Sc to the connection port 10 to adjust the voltage value of the power supply Vs from the power supply unit 200 to be 20V. Namely, the new test can be automatically started from testing of 20V output from the power supply unit 200 without the need of switching the power supply Vs supplied by the power supply unit from the default voltage (for example: 5V) to 20V through the switch units.

It should be noted that in the embodiment, the switch units (S1-S6) are button type switches, pressing one of the switch units (assumed to be S1) represents that the switch unit S1 is turned on, and the rest of the switch units (S2-S6) are turned off. If another switch unit (assumed to be S6) is turned on, the switch unit S1 turned on previously will be turned off first, thus the switch units (S1-S5) are turned off, but not limited. In other words, a switch unit can satisfy the inventive correspondence as long as the switch unit can achieve the above performance.

Figure 2:
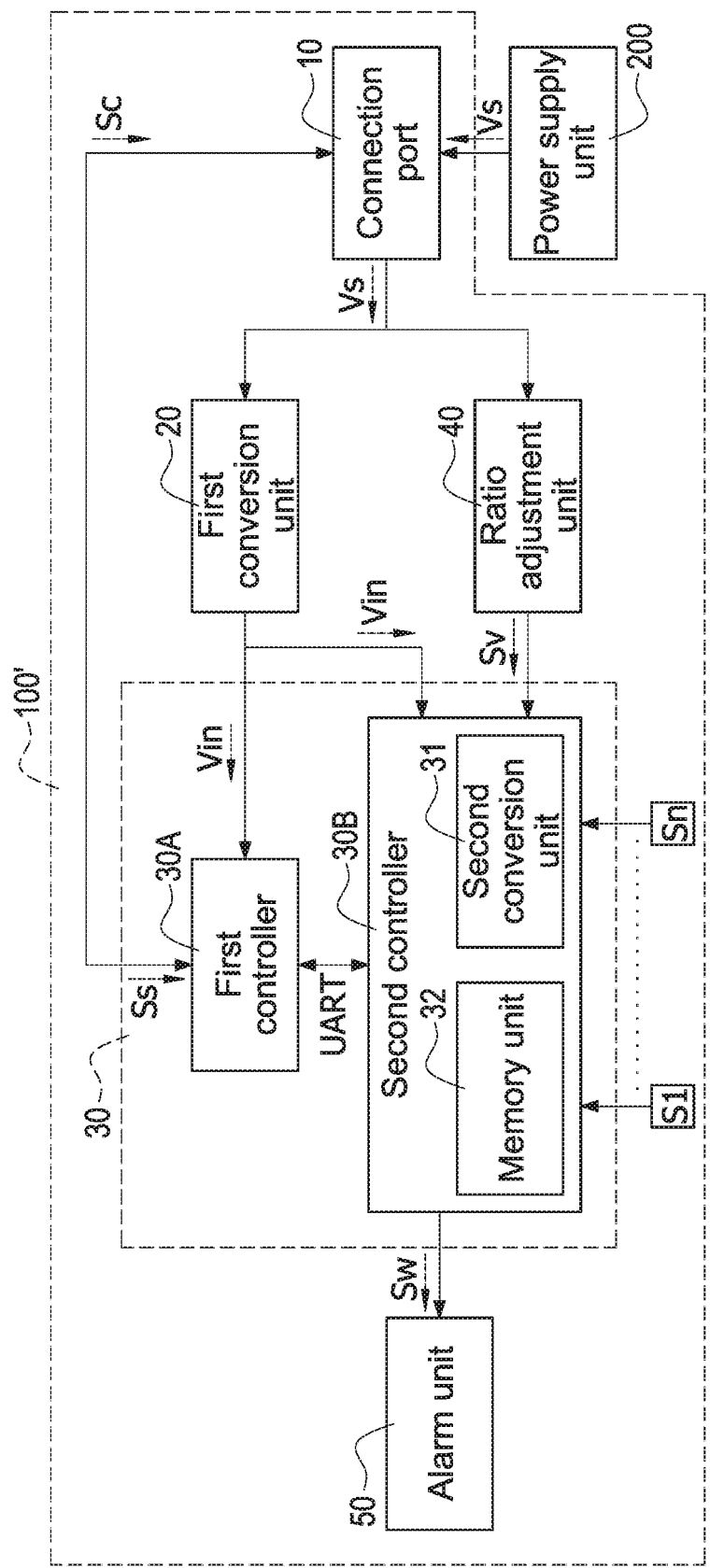
FIG. 2 shows a block diagram of a circuit of the power supply unit testing apparatus according to a second embodiment of the present invention.

Please refer to FIG. 2, FIG. 2 shows a block diagram of a circuit of the power supply unit testing apparatus according to a second embodiment of the present invention. Refer also to FIG. 1, the power supply unit testing apparatus 100' of the second embodiment is different from that of the first embodiment, the difference is that the control unit 30 further includes a first controller 30A and a second controller 30B. The first controller 30A is connected to the connection port 10 and the first conversion unit 20, and is configured to receive the input voltage Vin. The second controller 30B is connected to the first controller 30A and the first conversion unit 20, and is configured to receive the input voltage Vin. Since the input voltage Vin provides the power to the first controller 30A and to the second controller 30B, the power supply Vs from the power supply unit 200 provides the power source to the power supply unit testing apparatus 100', it means that the power supply unit testing apparatus 100' does not need other power sources except the power supply Vs from the power supply unit 200. The first controller 30A is a USB power supply delivery controller (USB-PD Controller), and used for converting and transmitting information between the power supply unit 200 and the second controller 30B. The second controller 30B at least includes memory function and analog to digital conversion function, and receives the power supply information Ss of the connection port 10, and outputs the control signal Sc to the connection port 10 through the first controller 30A, and then further control the power supply unit 200 to be switched to different voltage values. It should be noted that in the embodiment, the information is transmitted between the first controller 30A and the second controller 30B through universal asynchronous receiver/transmitter (UART), but not limited. In other words, a transmitter or connection method can satisfy the inventive correspondence as long as the transmitter or connection method can achieve the information transmission between two controllers.

Refer to FIG. 2 again, and refer also to FIG. 1. The second controller 30B includes a second conversion unit 31, the second controller 30B is connected to the alarm unit 50, and the second conversion unit 31 is connected to the ratio adjustment unit 40, the first controller 30A or the second controller 30B includes a memory unit 32. The memory unit 32, the second conversion unit 31, the ratio adjustment unit 40 and the alarm unit 50 have the operation and function the same as that in the first embodiment, detailed description is not repeated here. It should be noted that in the embodiment, the memory unit 32 can also be another element independent from the controller. In other words, a memory unit can satisfy the inventive correspondence as long as voltage information can be stored in the memory unit, no matter the memory unit 32 is built in any controller or mounted outside the controller. Besides, the alarm unit 50 can also be connected to the first controller 30A. In other words, a power supply unit 200 and an alarm unit can satisfy the inventive correspondence as long as a message of switch failure of the power supply Vs from the power supply unit 200 is transmitted to the alarm unit 50, no matter the alarm unit 50 is connected to the first controller 30A or the second controller 30B.

Refer to FIG. 2 for example, assuming that the power supply unit 200 supports the switching of four different voltage values for the power supply Vs, such as 5V, 10V, 15V, 20V, and the power supply unit testing apparatus 100' includes four switch units (S1-S4). Therefore, the first controller 30A receives the power supply information Ss, the second controller 30B and the UART obtains that the power supply unit 200 has four different voltage values for the power supply Vs, and has following correspondence with respect to the switch units (S1, 5V; S2, 10V; S3, 15V; S4, 20V) through the first controller 30A. When one switch unit (such as the switch unit S3) is turned on, the memory unit 32 records the ideal voltage value 15V corresponding to the switch unit S3. At this moment, the second controller 30B controls the first controller 30A to output a control signal Sc to the connection port 10 through the UART, and makes the power supply unit 200 output the voltage value (15V) corresponding to the switch unit S3. The ratio adjustment unit 40 adjusts the ratio the voltage value (15V) proportionally to the voltage value withstood by the second conversion unit 31 (assume that 15V is correspondingly adjusted to 3V proportionally), the second conversion unit 31 converts the received analog voltage value 3V to a digital signal according to a resolution of the analog to digital converter and feasible for determination of the second controller 30B. The second controller 30B determines if the ideal voltage value (15V) corresponding to the switch unit S3 matches a digital signal from the second conversion unit 31, to make sure if the actual voltage value of the power supply Vs from the power supply unit 200 matches the ideal voltage value (15V) corresponding to the switch unit S3. It should be noted that in the embodiment, the resolution of the second conversion unit 31 is not limited. A control unit and a second controller can satisfy the inventive correspondence as long as the control unit is achieved and the second controller can determine if the voltage value of the power supply Vs matches the resolution of the voltage value to which the corresponding switch unit corresponds. Besides, in the embodiment, the control unit 30, there would be a microprocessor (not shown) in the first controller 30A and the second controller 30B for transmitting, conversion, calculation, control, and memorizing the signal or power supply.

When the second controller 30B determines that the voltage value (15V) to which the switch unit S3 does not correspond to the digital signal on the second conversion unit 31 (assume that the digital signal corresponds to the voltage value of 10V), the second controller sends the alarm signal Sw to the alarm unit 50, to alarm that the test of the power supply unit 200 is failed. When the switch units (S1-S4) are turned on sequentially, the memory unit 32 memorizes the voltage value of the power supply Vs to which the switch units (S1-S4) turned on correspond, and it is assumed that the memory unit 32 memorizes the last voltage value from the power supply before being powered off is 10V. When the same power supply unit 200 is tested with a different input voltage (for example: input AC 110V is switched to 220V) or when the test is finished and the power supply unit 200 is removed, the power supply Vs will be powered off first and then be powered on. When the power supply Vs is powered off, the power supply unit testing apparatus 100' is also powered off. When another power supply unit 200' (not shown) with the same specification of output number and voltage is further tested, or the same power supply unit 200 is switched to a different input voltage (for example: 110V is switched to 220V), the second controller 30B controls the first controller 30A to directly send the control signal Sc to the connection port 10 to adjust the voltage value of the power supply Vs from the power supply unit to be 10V through the UART, without the need of switching the power supply Vs from the power supply unit from the default voltage (for example: 5V) to 10V through the switch units.

Figure 3:
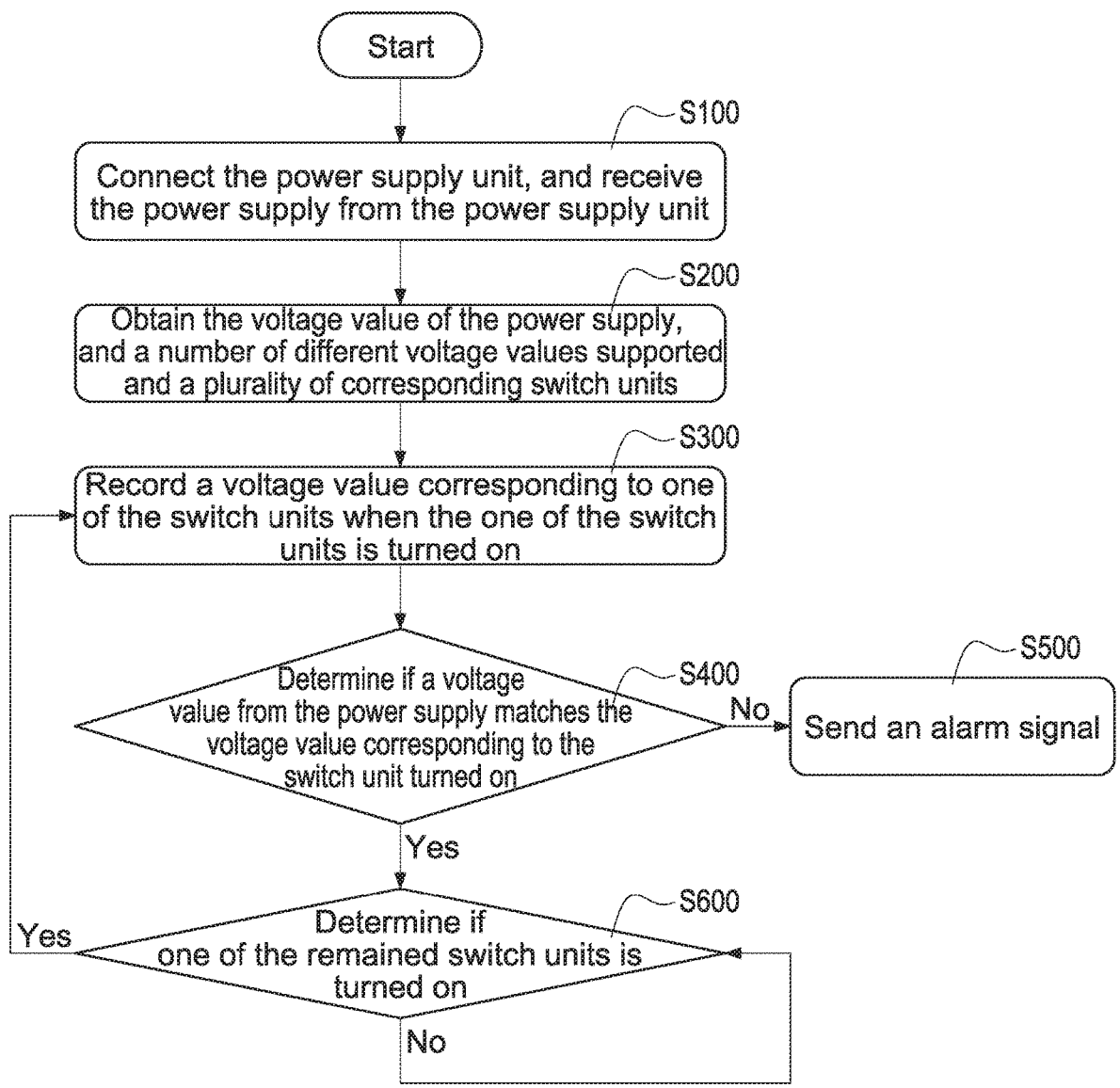
FIG. 3 shows a flowchart of a circuit of the power supply unit testing method of the present invention.

Please refer to FIG. 3, FIG. 3 shows a flowchart of a circuit of the power supply unit testing method of the present invention. Refer also to FIGS. 1-2, the testing method includes: firstly, connecting the power supply unit, and receiving the power supply from the power supply unit (S100). The testing method provides a power supply unit testing apparatus 100, and the power supply unit testing apparatus 100 has a connection port 10 with the USB Type-C, and is connected to a power supply unit 200 having a USB Type-C connection port. The connection port 10 receives a power supply Vs from the power supply unit 200. Afterward, obtaining the voltage value of the power supply, and a number of different voltage values supported and a plurality of corresponding switch units (S200) according to power supply information Ss. The power supply unit testing apparatus 100 obtains the voltage value of the power supply Vs, and a number of different voltage values supported according to the power supply information Ss in the power supply Vs. The number of voltage values supportable by the power supply Vs is that of different voltage values for the power supply Vs, and each voltage value corresponds to one of the switch units (S1-Sn) of the power supply unit testing apparatus 100. Afterward, recording a voltage value corresponding to one of the switch units when the one of the switch units is turned on (S300). When one switch unit (assumed to be the switch unit S3) is turned on, the memory unit 32 records the ideal voltage value corresponding to the switch unit S3.

Refer to FIG. 3 again, and refer also to FIGS. 1-2. After step S300, determining if a voltage value from the power supply matches the voltage value corresponding to the switch unit turned on (S400). The power supply unit testing apparatus 100 determines if the voltage value of the power supply Vs matches an ideal voltage value corresponding to the one of the switch units (S1-Sn). According to an embodiment, the power supply unit testing apparatus 100 obtains if the voltage value from the power supply Vs matches the ideal voltage value corresponding to one of the switch units turned on (S1-Sn) through the ratio adjustment unit 40 and the second conversion unit 31, and determines if the power supply Vs from the power supply unit 200 is switched successfully. Finally, sending an alarm signal (S500). When the power supply unit testing apparatus 100 determines an actual voltage value from the power supply Vs on the second conversion unit 31 does not match the ideal voltage value corresponding to the turned on switch units (S1-Sn), the switch of the power supply Vs for the power supply unit 200 is failed, thus, sending an alarm signal Sw to an alarm unit 50, to alarm a user that the power supply unit 200 would be out of function.

Please refer to FIG. 3, and refer also to FIGS. 1-2. When step S400 is passed, it represents that the power supply unit testing apparatus 100 determines the voltage value from the power supply matches the ideal voltage value corresponding to the one of the switch units. Afterward, determining if one of the remained switch units is turned on (S600). If the power supply unit testing apparatus 100 determines the actual voltage value for the power supply Vs on the second conversion unit 31 matches the ideal voltage value corresponding to one of the switch units (assumed to be the switch unit S1), next voltage value for the power supply Vs can be tested continuously to determine if the ideal voltage value corresponding to one of the switch units (S2-Sn) is matched. If next voltage value for the power supply Vs is to be tested, it returns to step S300.

It can be seen from FIG. 3, the power supply unit testing apparatus 100 performs the memorization in step S300. The control unit 30 or the second controller 30B of the power supply unit testing apparatus 100 provides a memory unit 32, the memory unit 32 records the voltage value of the power supply Vs. Therefore, when another power supply unit 200' (not shown) with the same specification of output number and voltage is further tested, or the same power supply unit 200 is switched to a different input voltage, the control unit 30 directly sends a control signal Sc to the connection port 10 to adjust the power supply Vs of the power supply unit to the voltage value of the power supply Vs before a previous power supply unit 200 is powered off. Therefore when the test of the power supply unit is repeated, there is no need to start the test from the default voltage (for example: 5V). Thus the test time of the power supply unit 200 can be decreased, resulting in high test efficiency.

To sum up, the present invention has the following advantages:

1. No additional power source provided to a power supply unit testing apparatus is needed: using the first conversion unit 20 converting the power supply Vs from the power supply unit 200 to the input voltage Vin, and supplying the power to the control unit 30, to achieve the test of power supply unit without the need of additional power source, and make the flexible usage.

2. Output voltage of the power supply unit can be recorded before the power supply unit testing apparatus is powered off: using the memory unit 32 to record the voltage value from the power supply unit before the testing apparatus is powered off. When testing another power supply unit or using different input voltage to test, the voltage value of the power supply from the power supply unit is not needed to be reset. Thus the test time of the power supply unit is decreased, and the efficiency of the power supply unit testing apparatus is increased.

3. Checking output of the power supply unit: using the feedback route of the second conversion unit 31 to make sure if the output of the power supply unit matches the voltage value selected by the power supply unit testing apparatus, to prevent a misjudgment for yield rate of the power supply unit.

Thus, particular embodiments have been described. Other embodiments are within the scope of the following claims. For example, the actions recited in the claims may be performed in a different order and still achieve desirable results.

What is claimed is:

1. A power supply unit testing apparatus connected to a power supply unit, the power supply unit testing apparatus comprising:
a connection port being configured to receive a power supply from the power supply unit;
a first conversion unit being connected to the connection port, and configured to convert a power source of the power supply to an input voltage;
a plurality of switch units,
a control unit being connected to the connection port, the plurality of switch units and the first conversion unit, and configured to receive the input voltage, the control unit comprising:
a second conversion unit electrically connected to the connection port,
wherein
a power source of the power supply unit testing apparatus is from the power supply of the power supply unit,
the control unit obtains a voltage value of the power supply and a number of different voltage values supportable by the power supply according to power supply information of the connection port, the number of the voltage values supportable by the power supply is that of the different voltage values supportable by the power supply unit, and each voltage value corresponds to one of the switch units, and
when one of the switch units is turned on, the control unit determines if the voltage value of the power supply matches an ideal voltage value corresponding to one of the switch units according to the second conversion unit.

2. The power supply unit testing apparatus of claim 1, wherein when one of the switch units is turned on, the control unit outputs a control signal to the connection port, to adjust the voltage value of the power supply to an ideal voltage value corresponding to the one of the switch units.

3. The power supply unit testing apparatus of claim 1, wherein the power supply unit testing apparatus further comprises:
a ratio adjustment unit being connected between the connection port and the second conversion unit;
wherein the ratio adjustment unit adjusts a ratio of the power supply to a voltage value tolerable by the second conversion unit.

4. The power supply unit testing apparatus of claim 1, wherein the power supply unit testing apparatus further comprises:
an alarm unit being connected to the control unit;
wherein when the control unit determines that the voltage value of the power supply does not match the ideal voltage value corresponding to one of the switch units according to the second conversion unit, the control unit sends an alarm signal to the alarm unit.

5. The power supply unit testing apparatus of claim 1, wherein the control unit further comprises:
a memory unit configured to store the voltage value of the power supply according to the power supply information before the power supply unit testing apparatus is powered off.

6. The power supply unit testing apparatus of claim 5, wherein the memory unit is built in the control unit or mounted outside the control unit, and connected to the control unit.

7. A power supply unit testing apparatus connected to a power supply unit, the power supply unit testing apparatus comprising:
a connection port being configured to receive a power supply from the power supply unit;
a first conversion unit being connected to the connection port, and configured to convert a power source of the power supply to an input voltage; and
a control unit being connected to the connection port and the first conversion unit, and configured to receive the input voltage, the control unit comprising:
a first controller being connected to the connection port and the first conversion unit, and configured to receive the input voltage; and
a second controller being connected to the first controller and the first conversion unit, and configured to receive the input voltage,
wherein
a power source of the power supply unit testing apparatus is from the power supply of the power supply unit, and
the second controller receives power supply information of the connection port through the first controller, and outputs a control signal to control the voltage value of the power supply through the first controller.

8. The power supply unit testing apparatus of claim 7, wherein the power supply unit testing apparatus further comprises:
a plurality of switch units being connected to the second controller;

wherein the second controller obtains the voltage value of the power supply and a number of different voltage values supportable by the power supply according to the power supply information, the number of the voltage values supportable by the power supply is that of the different voltage values of the power supply, and each voltage value corresponds to one of the switch units.

9. The power supply unit testing apparatus of claim 8, wherein when one of the switch units is turned on, the second controller outputs the control signal to the connection port through the first controller, to adjust the voltage value of the power supply to an ideal voltage value corresponding to the one of the switch units.

10. The power supply unit testing apparatus of claim 8, wherein the second controller further comprises:
   a second conversion unit being electrically connected to the connection port;
   wherein when one of the switch units is turned on, the second controller determines if the voltage value of the power supply matches an ideal voltage value corresponding to the one of the switch units according to the second conversion unit.

11. The power supply unit testing apparatus of claim 10, wherein the power supply unit testing apparatus further comprises:
   a ratio adjustment unit being connected between the connection port and the second conversion unit;
   wherein the ratio adjustment unit adjusts a ratio of the power supply to a voltage value tolerable by the second conversion unit.

12. The power supply unit testing apparatus of claim 10, wherein the power supply unit testing apparatus further comprises:
   an alarm unit being connected to the second controller;
   wherein when the second controller determines that the power supply does not match the ideal voltage value corresponding to the one of the switch units according to the second conversion unit, the second controller sends an alarm signal to the alarm unit.

13. The power supply unit testing apparatus of claim 8, wherein the first controller or the second controller further comprises:
   a memory unit configured to store the voltage value of the power supply according to the power supply information before the power supply unit testing apparatus is powered off.

14. The power supply unit testing apparatus of claim 13, wherein the memory unit is built in the first controller or the second controller; or mounted outside the first controller, and connected to the first controller; or mounted outside the second controller, and connected to the second controller.

15. A power supply unit testing method used for testing a power supply unit, the testing method comprising:
   (a) providing a power supply unit testing apparatus being connected to the power supply unit, and configured to receive a power supply from the power supply unit;
   (b) using a control unit of the power supply unit testing apparatus to obtain a voltage value of the power supply and a number of different voltage values supportable by the power supply according to power supply information of the connection port, and each voltage value corresponding to a plurality of switch units of the power supply unit testing apparatus, and a number of voltage values supportable by the power supply is that the different voltage values of the power supply;
   (c) using the control unit to record an ideal voltage value corresponding to one of the switch units when the one of the switch units is turned on;
   (d) using the control unit of the power supply unit testing apparatus to determine if the voltage value of the power supply matches the ideal voltage value corresponding to the one of the switch units according to the second conversion unit; and
   (e) sending an alarm signal when the power supply unit testing apparatus determines that the voltage value of the power supply does not match the ideal voltage value corresponding to the one of the switch units.

16. The power supply unit testing method of claim 15, wherein the power supply unit testing apparatus further stores the voltage value of the power supply according to the power supply information before the power supply unit testing apparatus is powered off.

* * * * *